United States Patent
Wei et al.

(10) Patent No.: US 12,532,651 B2
(45) Date of Patent: Jan. 20, 2026

(54) PEROVSKITE SOLAR CELL AND METHOD FOR MANUFACTURING THE SAME

(71) Applicant: National Tsing Hua University, Hsinchu (TW)

(72) Inventors: Tzu-Chien Wei, Hsinchu (TW); Tzu-Sen Su, Yilan County (TW); Han-Tu Lin, Hsinchu County (TW); Shiang Lan, Taoyuan (TW)

(73) Assignee: National Tsing Hua University, Hsinchu (TW)

( * ) Notice: Subject to any disclaimer, the term of this patent is extended or adjusted under 35 U.S.C. 154(b) by 0 days.

(21) Appl. No.: 18/500,077

(22) Filed: Nov. 1, 2023

(65) Prior Publication Data
US 2024/0155932 A1   May 9, 2024

(30) Foreign Application Priority Data
Nov. 4, 2022   (TW) .................................. 111142241

(51) Int. Cl.
*H10K 71/16*   (2023.01)
*H10K 30/15*   (2023.01)
(Continued)

(52) U.S. Cl.
CPC ........... *H10K 71/164* (2023.02); *H10K 30/40* (2023.02); *H10K 30/50* (2023.02); *H10K 30/85* (2023.02); *H10K 30/151* (2023.02)

(58) Field of Classification Search
None
See application file for complete search history.

(56) References Cited

U.S. PATENT DOCUMENTS

| | | | | |
|---|---|---|---|---|
| 4,465,736 A | * | 8/1984 | Nishihara | B32B 15/08 428/458 |
| 4,556,277 A | * | 12/1985 | Fan | F24S 80/52 359/360 |

(Continued)

FOREIGN PATENT DOCUMENTS

| | | |
|---|---|---|
| CN | 110544745 A | 12/2019 |
| CN | 115000210 A | 9/2022 |

(Continued)

OTHER PUBLICATIONS

Vivo et al., Organic Electronics, 41, (2017) 287-293. (Year: 2017).*
(Continued)

*Primary Examiner* — Eli S Mekhlin
(74) *Attorney, Agent, or Firm* — Li & Cai Intellectual Property Office (57) ABSTRACT

A perovskite solar cell and a method for manufacturing the same are provided. The method includes: sputtering a compact layer onto a light transmitting electrode, in which the compact layer has a thickness ranging from 20 nm to 120 nm, and a material of the compact layer is titanium dioxide; sputtering a roughened layer onto the compact layer, in which the roughened layer has a thickness ranging from 20 nm to 30 nm, and a material of the roughened layer is titanium dioxide; disposing a perovskite layer onto the roughened layer; disposing a hole transporting layer onto the perovskite layer; and disposing a back electrode onto the hole transporting layer.

12 Claims, 6 Drawing Sheets

(51) Int. Cl.
  *H10K 30/40* (2023.01)
  *H10K 30/50* (2023.01)
  *H10K 30/85* (2023.01)

(56) References Cited

U.S. PATENT DOCUMENTS

| | | |
|---|---|---|
| 9,231,136 B2 | 1/2016 | Wu et al. |
| 2003/0230337 A1* | 12/2003 | Gaudiana ............... H10K 39/10 |
| | | 136/256 |
| 2011/0096595 A1* | 4/2011 | Terai .................... H10N 70/826 |
| | | 365/163 |
| 2015/0136232 A1* | 5/2015 | Snaith ....................... C07F 7/24 |
| 2018/0218845 A1* | 8/2018 | Tan ...................... H01G 9/2072 |
| 2018/0350529 A1* | 12/2018 | Chen ...................... H10K 71/12 |

FOREIGN PATENT DOCUMENTS

| | | | | |
|---|---|---|---|---|
| KR | 20110123484 A | * | 11/2011 | ........... H10K 30/151 |
| TW | 201607092 A | | 2/2016 | |

OTHER PUBLICATIONS

English language machine translation of KR-20110123484-A. (Year: 2011).*

* cited by examiner

PEROVSKITE SOLAR CELL AND METHOD FOR MANUFACTURING THE SAME

CROSS-REFERENCE TO RELATED PATENT APPLICATION

This application claims the benefit of priority to Taiwan Patent Application No. 111142241, filed on Nov. 4, 2022. The entire content of the above identified application is incorporated herein by reference.

Some references, which may include patents, patent applications and various publications, may be cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference was individually incorporated by reference.

FIELD OF THE DISCLOSURE

The present disclosure relates to a solar cell and a method for manufacturing the same, and more particularly to a perovskite solar cell and a method for manufacturing the same.

BACKGROUND OF THE DISCLOSURE

Recently, perovskite solar cells have attracted great attention. The perovskite solar cell has a high light absorption efficiency, such that photons can be quickly separated into electrons and electron holes, and the electrons are transported to an electrode for generation of an electric current. As such, compared to a conventional semiconductor solar cell, the perovskite solar cell can have a higher photoelectric conversion efficiency (PCE).

The perovskite solar cell can be classified into a planar perovskite solar cell and a mesoporous perovskite solar cell. The planar perovskite solar cell includes a light transmitting electrode, an electron transporting layer (ETL), a perovskite layer, a hole transporting layer (HTL), and a back electrode. The mesoporous perovskite solar cell includes the above-mentioned layers, and further includes a mesoporous layer disposed between the electron transporting layer and the perovskite layer. The mesoporous layer increases a contact area between the electron transporting layer and a crystal structure of the perovskite layer, and can further be used as nucleation sites. In this way, a transmission efficiency of electrons can be enhanced.

Figure 10:
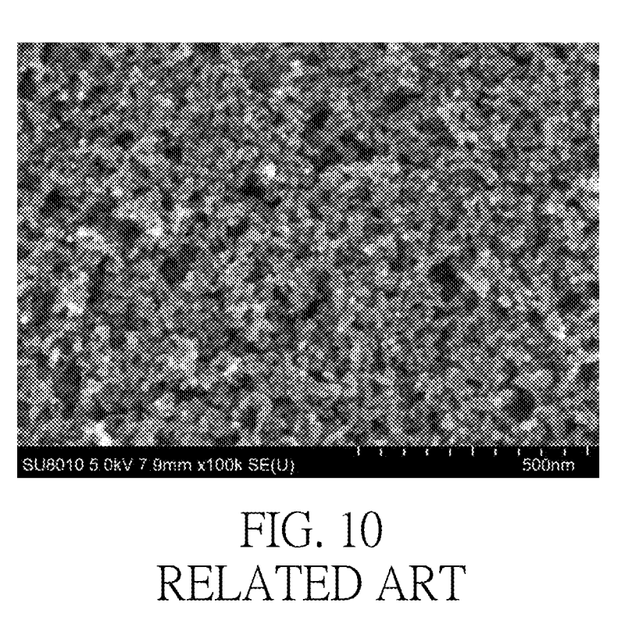
FIG. 10 is a scanning electron microscope image of a mesoporous layer formed by spin coating in the related art.

Reference is made to FIG. 10, which is a scanning electron microscope image of the mesoporous layer (i.e., a titanium dioxide layer) formed by spin coating. The structure of the mesoporous layer is loose. The mesoporous layer can be formed by spin coating, spray pyrolysis, microwave sintering, and magnetron sputtering. In these manners, spin coating and spray pyrolysis are widely used. However, the mesoporous layer formed by spin coating or spray pyrolysis needs to undergo an annealing process under a temperature higher than 450° C. Hence, the mesoporous layer has disadvantages of high energy consumption and not being applicable to flexible devices.

SUMMARY OF THE DISCLOSURE

In response to the above-referenced technical inadequacies, the present disclosure provides a perovskite solar cell and a method for manufacturing the same.

In order to solve the above-mentioned problems, one of the technical aspects adopted by the present disclosure is to provide a method for manufacturing a perovskite solar cell. The method includes: sputtering a compact layer onto a light transmitting electrode; sputtering a roughened layer onto the compact layer; disposing a perovskite layer onto the roughened layer; disposing a hole transporting layer onto the perovskite layer; and disposing a back electrode onto the hole transporting layer. The compact layer has a thickness ranging from 20 nm to 120 nm, and a material of the compact layer is titanium dioxide. The roughened layer has a thickness ranging from 20 nm to 30 nm, and a material of the roughened layer is titanium dioxide.

In order to solve the above-mentioned problems, another one of the technical aspects adopted by the present disclosure is to provide a perovskite solar cell. The perovskite solar cell is manufactured by the method mentioned above. The compact layer and the roughened layer are used as an electron transporting layer. A first carrier lifetime from being generated by the perovskite layer to transport to the electron transporting layer ranges from 40 ns to 60 ns. A second carrier lifetime from being generated by the perovskite layer to transport to the electron transporting layer ranges from 360 ns to 420 ns.

In order to solve the above-mentioned problems, yet another one of the technical aspects adopted by the present disclosure is to provide a perovskite solar cell. The perovskite solar cell includes: a light transmitting electrode, a compact layer, a roughened layer, a perovskite layer, a hole transporting layer, and a back electrode. The compact layer is disposed on the light transmitting electrode. The compact layer has a thickness ranging from 20 nm to 120 nm. A material of the compact layer is titanium dioxide. The roughened layer is disposed on the compact layer. The roughened layer has a thickness ranging from 20 nm to 30 nm. A material of the roughened layer is titanium dioxide. The perovskite layer is disposed on the roughened layer. The hole transporting layer is disposed on the perovskite layer. The back electrode is disposed on the hole transporting layer. A surface roughness of the roughened layer is higher than a surface roughness of the compact layer.

Therefore, in the perovskite solar cell and the method for manufacturing the same provided by the present disclosure, by virtue of "sputtering a compact layer onto a light transmitting electrode, in which the compact layer has a thickness ranging from 20 nm to 120 nm" and "sputtering a roughened layer onto the compact layer, in which the roughened layer has a thickness ranging from 20 nm to 30 nm," a transmission efficiency of photogenerated electrons in the perovskite solar cell can be enhanced.

These and other aspects of the present disclosure will become apparent from the following description of the embodiment taken in conjunction with the following drawings and their captions, although variations and modifications therein may be affected without departing from the spirit and scope of the novel concepts of the disclosure.

BRIEF DESCRIPTION OF THE DRAWINGS

The described embodiments may be better understood by reference to the following description and the accompanying drawings, in which.

DETAILED DESCRIPTION OF THE EXEMPLARY EMBODIMENTS

The present disclosure is more particularly described in the following examples that are intended as illustrative only since numerous modifications and variations therein will be apparent to those skilled in the art. Like numbers in the drawings indicate like components throughout the views. As used in the description herein and throughout the claims that follow, unless the context clearly dictates otherwise, the meaning of "a," "an" and "the" includes plural reference, and the meaning of "in" includes "in" and "on." Titles or subtitles can be used herein for the convenience of a reader, which shall have no influence on the scope of the present disclosure.

The terms used herein generally have their ordinary meanings in the art. In the case of conflict, the present document, including any definitions given herein, will prevail. The same thing can be expressed in more than one way. Alternative language and synonyms can be used for any term(s) discussed herein, and no special significance is to be placed upon whether a term is elaborated or discussed herein. A recital of one or more synonyms does not exclude the use of other synonyms. The use of examples anywhere in this specification including examples of any terms is illustrative only, and in no way limits the scope and meaning of the present disclosure or of any exemplified term. Likewise, the present disclosure is not limited to various embodiments given herein. Numbering terms such as "first," "second" or "third" can be used to describe various components, signals or the like, which are for distinguishing one component/signal from another one only, and are not intended to, nor should be construed to impose any substantive limitations on the components, signals or the like.

Figure 1:
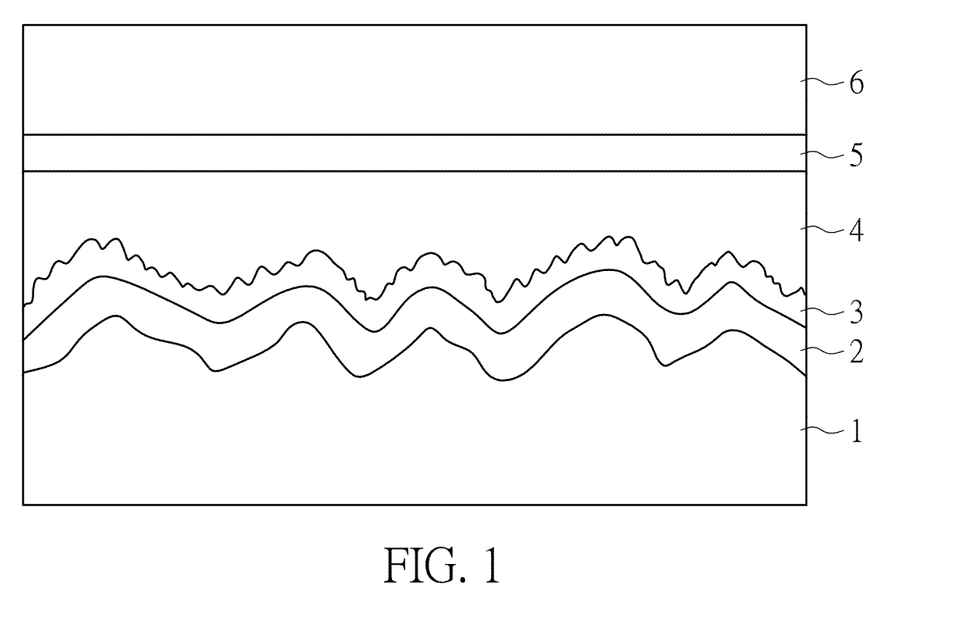
FIG. 1 is a schematic side view of a perovskite solar cell according to the present disclosure.

Referring to FIG. 1, a perovskite solar cell of the present disclosure includes a light transmitting electrode 1, a compact layer 2, a roughened layer 3, a perovskite layer 4, a hole transporting layer 5, and a back electrode 6. The compact layer 2 and the roughened layer 3 are used as an electron transporting layer, so as to transport photogenerated electrons and prevent recombination of photogenerated holes and the photogenerated electrons.

The roughened layer 3 can increase a surface roughness of the compact layer 2 and a contact area between the electron transporting layer (i.e., the compact layer 2 and the roughened layer 3) and the perovskite layer 4. Moreover, nucleation sites of perovskite can also be increased, which is beneficial for enhancing a transmission efficiency of the photogenerated electrons. It should be noted that the roughened layer 3 of the present disclosure is a continuous thin film, and the compact layer 2 is completely covered by the roughened layer 3. Since pores are absent from the roughened layer 3 of the present disclosure, the roughened layer 3 is different from a conventional mesoporous layer.

Figure 2:
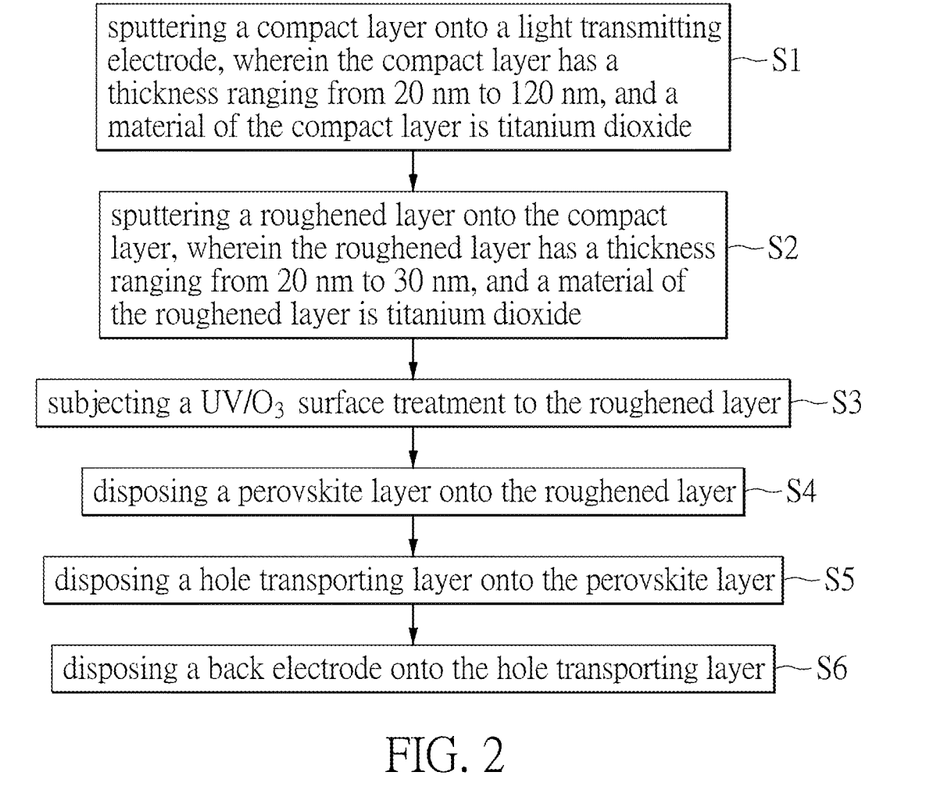
FIG. 2 is a flowchart of a method for manufacturing the perovskite solar cell according to the present disclosure.

Referring to FIG. 2, a method for manufacturing the perovskite solar cell of the present disclosure includes steps as follows.

In step S1, a compact layer having a thickness of from 20 nm to 120 nm is sputtered and formed onto a light transmitting electrode. A material of the compact layer is titanium dioxide. A material of the light transmitting electrode can be fluorine-doped tin oxide (FTO) or indium tin oxide (ITO), but the present disclosure is not limited thereto.

In the present disclosure, a DC plasma sputtering method is adopted to form the compact layer. A titanium target is impacted by ionic plasma. Metals on a surface of the titanium target are separated from the titanium target by the impact of the ionic plasma. Due to an electric field, the metals move toward the light transmitting electrode, and then are deposited on the light transmitting electrode to form the compact layer.

Specifically, the light transmitting electrode is disposed in a sputtering chamber, and then the sputtering chamber is vacuumed to reach a pressure of $8\times10^{-6}$ Torr. A power of a DC power source is set at 8,000 W with a voltage of 465 V and a current of 17.8 A. A stage moving speed is 0.5 rpm, and a quantity of sputtering turns is 131. An argon gas (which is used as an inert gas) of a flow rate of 100 standard cubic centimeter per minute (sccm) and an oxygen gas of a flow rate of 130 sccm are introduced into the sputtering chamber, so as to oxidize a titanium metal for formation of titanium dioxide. At this time, a sputtering pressure in the sputtering chamber ranges from $1\times10^{-3}$ Torr to $5\times10^{-3}$ Torr, and is preferably $3\times10^{-3}$ Torr. The compact layer is formed by a sputtering rate ranging from 240 nm to 280 nm under a target power density of kilowatt per meter and a stage moving speed of meter per minute.

In order to meet practical requirements, the thickness, the structure, and properties of the compact layer are adjusted by controlling the flow rates of the argon gas and the oxygen gas. For example, in an atmosphere in which the compact layer is formed, a ratio of the flow rate of the inert gas to the flow rate of the oxygen gas ranges from 0.65 to 0.85.

Compared to spin coating, the thickness of metal deposition formed by sputter coating can be precisely controlled. Specifically, while a minimum thickness unit of the metal deposition formed by sputter coating can be 5 nm, a minimum thickness unit of the metal deposition formed by spin coating is higher than 20 nm.

Examples 1A to 3A

According to step S1, compact layers having a thickness of 25 nm (Example 1A), 50 nm (Example 2A), and 100 nm (Example 3A) are each formed on a fluorine-doped tin oxide substrate (the light transmitting electrode), so as to form laminate structures of Examples 1A to 3A.

During formation of a roughened layer, the flow rate of the argon gas is 100 sccm, the flow rate of the oxygen gas is 130 sccm, and the sputtering pressure in the sputtering chamber is $3\times10^{-3}$ Torr. In an atmosphere in which the roughened layer is formed, the flow rate of the inert gas is 0.77 times the flow rate of the oxygen gas, and the sputtering rate is 4 nm per second. However, the present disclosure is not limited thereto.

Figure 3:
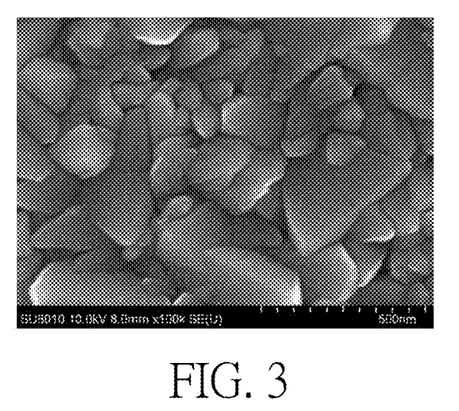
FIG. 3 is a scanning electron microscope image of a laminate structure according to Example 1A of the present disclosure.
Figure 4:
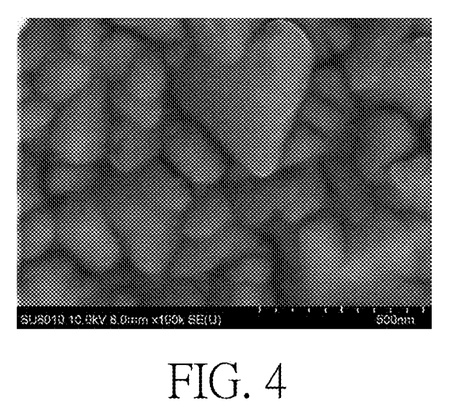
FIG. 4 is a scanning electron microscope image of the laminate structure according to Example 2A of the present disclosure.

Properties of the laminate structures of Examples 1A to 3A are listed in Table 1. Scanning electron microscope images of the laminate structures of Examples 1A to 3A are respectively shown in FIG. 3 to FIG. 5.

TABLE 1

|  | Example 1A | Example 2A | Example 3A |
|---|---|---|---|
| Sputtering deposition time of compact layer (second) | 5 to 6 | 10 to 12 | 20 to 24 |
| Thickness of compact layer (nm) | 25 | 50 | 100 |

In step S2, the roughened layer having a thickness ranging from 20 nm to 30 nm is sputtered and formed onto the compact layer. A material of the roughened layer is titanium dioxide.

Step S2 is similar to step S1, in which the DC plasma sputtering method is adopted to form the roughened layer by impacting a titanium target with ionic plasma. Metals on a surface of the titanium target are separated from the titanium target by the impact of the ionic plasma. Due to an electric field, the metals move toward the compact layer, and then are deposited on the compact layer to form the roughened layer.

The difference between step S1 and step S2 is sputtering parameters. Specifically, after the compact layer is sputtered and formed, the sputtering chamber is vacuumed to reach a pressure of $8\times10^{-6}$ Torr. The power of the DC power source is set at 4,000 W. The stage moving speed is 0.5 rpm, and the quantity of sputtering turns is 76. Subsequently, the argon gas (which is used as an inert gas) of a flow rate of 735 sccm and the oxygen gas of a flow rate of 130 sccm are introduced into the sputtering chamber, so as to oxidize the titanium metal for formation of titanium dioxide. At this time, the sputtering pressure in the sputtering chamber ranges from $6\times10^{-3}$ Torr to $1\times10^{-2}$ Torr. The roughened layer is formed by a sputtering rate ranging from 120 nm to 180 nm under a target power density of kilowatt per meter and a stage moving speed of meter per minute.

In order to meet practical requirements, the thickness, the structure, and properties of the roughened layer are adjusted by controlling the flow rates of the argon gas and the oxygen gas. For example, in the atmosphere in which the roughened layer is formed, a ratio of the flow rate of the inert gas to the flow rate of the oxygen gas ranges from 4.5 to 6.5.

By adjusting the sputtering parameters, the compact layer and the roughened layer with different properties can be formed. For example, during formation of the roughened layer, the flow rate of the argon gas and the sputtering pressure are higher, such that the roughened layer formed from a deposition material has a loose structure. Therefore, compared to the compact layer, the roughened layer has a higher surface roughness.

In the present disclosure, the compact layer and the roughened layer have different surface morphologies, such as surface roughness. Since a surface of the fluorine-doped tin oxide substrate (the light transmitting electrode) is not even, it is difficult to distinguish the compact layer from the roughened layer by the surface roughness. In the present disclosure, the properties and the functions of the compact layer and the roughened layer are measured by a scanning electron microscope (SEM), and are subjected to a steady-state photoluminescence testing and a time-resolved photoluminescence testing.

Examples 1B to 3B

According to step S2, the roughened layer having a thickness of 25 nm is respectively formed on the compact layer of Examples 1A to 3A, so as to form the laminate structures of Examples 1B to 3B.

During formation of the roughened layer, the flow rate of the argon gas is 735 sccm, the flow rate of the oxygen gas is 130 sccm, and the sputtering pressure in the sputtering chamber is $9.8\times10^{-3}$ Torr. In an atmosphere in which the roughened layer is formed, the flow rate of the inert gas is 5.65 times the flow rate of the oxygen gas, and the sputtering rate ranges from 2 nm/second to 3 nm/second.

Figure 6:
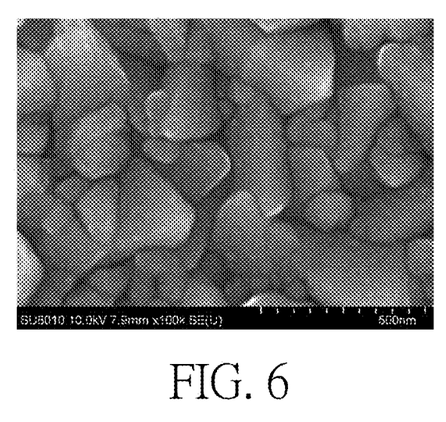
FIG. 6 is a scanning electron microscope image of the laminate structure according to Example 1B of the present disclosure.
Figure 7:
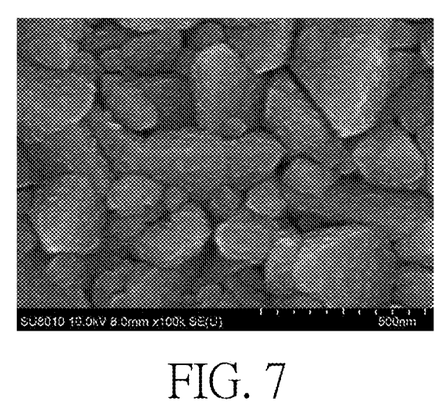
FIG. 7 is a scanning electron microscope image of the laminate structure according to Example 2B of the present disclosure.

Properties of the laminate structures of Examples 1B to 3B are listed in Table 2. Scanning electron microscope images of the laminate structures of Examples 1B to 3B are respectively shown in FIG. 6 to FIG. 8.

TABLE 2

|  | Example 1B | Example 2B | Example 3B |
|---|---|---|---|
| Thickness of compact layer (nm) | 25 | 50 | 100 |
| Sputtering deposition time of roughened layer (second) | 8 to 12 | 8 to 12 | 8 to 12 |
| Thickness of roughened layer (nm) | 25 | 25 | 25 |

For ease of comparison, reference is made to FIG. 3 to FIG. 8. Compared to the laminate structures of Examples 1A to 3A (FIG. 3 to FIG. 5), the laminate structures of Examples 1B to 3B (FIG. 6 to FIG. 8) have rougher surfaces.

Figure 5:
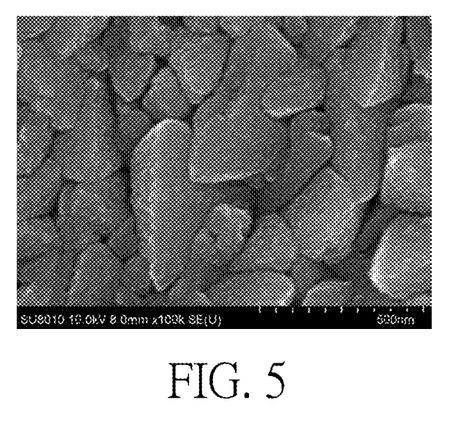
FIG. 5 is a scanning electron microscope image of the laminate structure according to Example 3A of the present disclosure.
Figure 8:
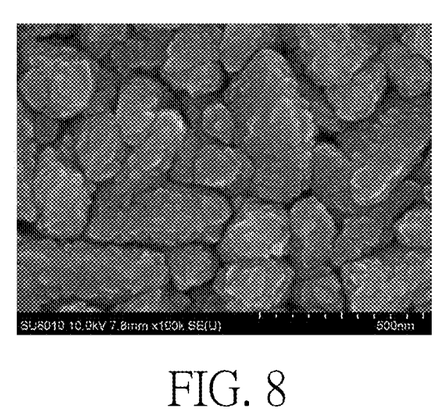
FIG. 8 is a scanning electron microscope image of the laminate structure according to Example 3B of the present disclosure.

For example, an SEM image of the compact layer having a thickness of 100 nm formed on the fluorine-doped tin oxide substrate (the light transmitting electrode) is shown in FIG. 5, and an SEM image of the roughened layer having a thickness of 25 nm and the compact layer having a thickness of 100 nm formed on the fluorine-doped tin oxide substrate (the light transmitting electrode) is shown in FIG. 8. It can be observed from FIG. 5 and FIG. 8 that, the fluorine-doped tin oxide substrate having both of the roughened layer and the compact layer (FIG. 8) has a rougher surface than the fluorine-doped tin oxide substrate only having the compact layer (FIG. 5).

A comparison between FIG. 8 and FIG. 10 shows that the roughened layer formed by sputtering (FIG. 8) and the roughened layer formed by spin coating (FIG. 10) have different surface morphologies. In the mesoporous layer formed by spin coating, the high roughness of its surface morphology is directly formed, thereby increasing the surface roughness. In the present disclosure, by adjusting the parameters and implementing a surface roughening treatment by sputtering, the surface roughness of the light transmitting electrode can be increased.

In step S3, the roughened layer is subjected to a UV/O$_3$ surface treatment, such that a surface of the roughened layer is cleaned.

In step S4, the perovskite layer having a thickness ranging from 500 nm to 600 nm is formed onto the cleaned roughened layer by spin coating. After formation of the perovskite layer, the laminate structure is subjected to a steady-state photoluminescence testing and a time-resolved photoluminescence testing.

In the steady-state photoluminescence testing, carriers are generated after the perovskite layer is excited by light, and then the carriers are transported out by the electron transporting layer. If a low light intensity is measured, it indicates that more carriers are transported out by the electron transporting layer. Therefore, the carrier collection ability of the laminate structure can be quantified through fluorescence intensity graphs at different wavelengths.

Figure 9:
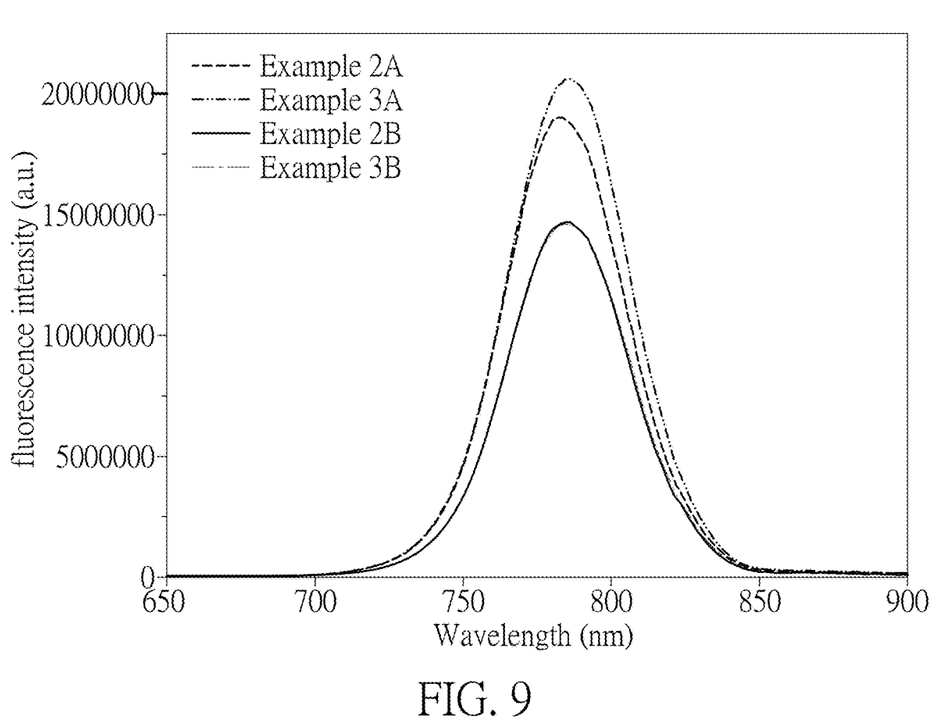
FIG. 9 is a steady-state photoluminescence image of the laminate structures according to Examples 2A, 3A, 2B, and 3B of the present disclosure.

The results of the laminate structures of Examples 2A, 3A, 2B, and 3B measured by the steady-state photoluminescence testing are shown in FIG. 9. It can be observed from FIG. 9 that, compared to the laminate structure only having the compact layer (Examples 2A and 3A), the laminate structure having both the compact layer and the roughened layer (Examples 2B and 3B) has a lower fluorescence intensity. Therefore, the laminate structures of Examples 2B and 3B have good carrier collection ability.

According to Examples 2A and 3A, when the roughened layer is absent from the laminate structure, the laminate structure (Example 2A) having a thinner compact layer has better carrier collection ability. According to Examples 2B and 3B, when the thicknesses of the roughened layers are the same, the laminate structures can have similar carrier collection ability irrespective of differences in thickness of the compact layers.

In the time-resolved photoluminescence testing, a carrier lifetime can be quantified by a fluorescence emission over a short period of time. If the light intensity detected by an instrument decays quickly, it indicates that the carriers are quickly transported from the laminate structure. Therefore, the carrier collection ability of the perovskite solar cell of the present disclosure can be quantified through the fluorescence intensity graph of fluorescence emission within a short period of time.

In the present disclosure, a first carrier lifetime ($\tau 1$) is a main phenomenon indicator of surface recombination occurred in a fast decay area which is formed by a high carrier concentration on a surface of the electron transporting layer. A second carrier lifetime ($\tau 2$) is a main phenomenon indicator of bulk recombination occurred in a slow decay area of a deep block part of the electron transporting layer.

The first carrier lifetime ($\tau 1$) and the second carrier lifetime ($\tau 2$) are measured via the principle of photoluminescence. An electromagnetic wave with energy greater than an energy level of the material is injected into the film. When energy is absorbed by the film, electrons of the film are excited to transmit from a valence band to a conduction band, and electron-hole pairs are formed. The electrons and the holes will be attracted to each other due to the Coulomb electrostatic force. Due to the attraction, a combination reaction occurs, and fluorescence is released at the same time. This phenomenon is referred to as relaxation. The time for carrier recombination can be measured via the principles of excitation and relaxation. Therefore, when a fixed wavelength laser (i.e., a single photon) generated by a time-resolved fluorescence spectrometer is injected into a thin film material, through a photon counting detector and a time difference between emission of the photon and detection of the photon (by a detector), a relaxation probability distribution of the excited fluorescence photons can be measured. Accordingly, a decay curve of intensity of the fluorescence photons over time can be obtained.

The first carrier lifetime ($\tau 1$) and the second carrier lifetime ($\tau 2$) can be obtained by fitting the decay curve with a biexponential function and referring to the following Formula (1). In Formula (1), "A1" and "A2" are respectively constants of the first carrier lifetime ($\tau 1$) and the second carrier lifetime ($\tau 2$), which can also be regarded as a distribution ratio of carrier recombination. The higher the constants "A1" and "A2" are, the higher the distribution ratio of carrier recombination is.

$$I(t)=A_1 e^{-t/\tau 1}+A_2 e^{-t/\tau 1} \qquad \text{Formula (1)}$$

The laminate structures of Example 3A and Example 3B are subjected to the time-resolved photoluminescence testing, and the results are listed in Table 3. The shorter the carrier lifetime is, the more efficiently the carrier is conducted, such that the laminate structure can have better carrier collection ability.

TABLE 3

|  | Example 3A | Example 3B |
| --- | --- | --- |
| Thickness of compact layer (nm) | 100 | 100 |
| Thickness of roughened layer (nm) | — | 25 |
| First carrier lifetime ($\tau 1$) (nm) | 70.2 | 53.2 |
| Second carrier lifetime ($\tau 2$) (nm) | 464.3 | 399.0 |

According to the results of Table 3, compared to the laminate structure (Example 3A) having only the compact layer, the laminate structure (Example 3B) having both the compact layer and the roughened layer has better carrier collection ability.

In step S5, a hole transporting layer is disposed on the perovskite layer. A material of the hole transporting layer can be (3,4-ethylenedioxythiophene):poly(styrenesulfonate) (PEDOT:PSS), poly(triaryl amine) (PTAA), or 2,2',7,7'-tetrakis[N,N-di(4-methoxyphenyl)amino]-9,9'-spirobifluorene (spiro-OMeTAD). However, the present disclosure is not limited thereto.

In step S6, a back electrode is disposed on the hole transporting layer.

Through step S1 to step S6, the perovskite solar cell of the present disclosure can be obtained. The perovskite solar cell of the present disclosure has good carrier collection ability. The electron transporting layer (including the compact layer and the roughened layer) is formed onto the light transmitting electrode by sputtering, such that an annealing treatment step taken after the mesoporous layer is formed by spin coating or spray pyrolysis can be omitted.

Beneficial Effects of the Embodiment

In conclusion, in the perovskite solar cell and the method for manufacturing the same provided by the present disclosure, by virtue of "sputtering a compact layer onto a light transmitting electrode, in which the compact layer has a thickness ranging from 20 nm to 120 nm" and "sputtering a roughened layer onto the compact layer, in which the roughened layer has a thickness ranging from 20 nm to 30 nm," a transmission efficiency of photogenerated electrons in the perovskite solar cell can be enhanced.

Further, by adjusting the parameters for sputtering, the compact layer and the roughened layer can have the specific morphologies, such that the electron transporting layer can have a higher surface roughness so as to increase a contact area between the electron transporting layer and the perovskite layer. Hence, the perovskite solar cell can have a good transmission efficiency of carriers.

The foregoing description of the exemplary embodiments of the disclosure has been presented only for the purposes of illustration and description and is not intended to be exhaustive or to limit the disclosure to the precise forms disclosed. Many modifications and variations are possible in light of the above teaching.

The embodiments were chosen and described in order to explain the principles of the disclosure and their practical application so as to enable others skilled in the art to utilize the disclosure and various embodiments and with various modifications as are suited to the particular use contemplated. Alternative embodiments will become apparent to those skilled in the art to which the present disclosure pertains without departing from its spirit and scope.

What is claimed is:

1. A method for manufacturing a perovskite solar cell, comprising:
   sputtering a compact layer onto a light transmitting electrode, wherein the compact layer has a thickness ranging from 20 nm to 120 nm, and a material of the compact layer is titanium dioxide;
   sputtering a roughened layer onto the compact layer, wherein the roughened layer is a continuous and pore-free thin film structure and has a thickness ranging from 20 nm to 25 nm, and a material of the roughened layer is titanium dioxide;
   disposing a perovskite layer onto the roughened layer;
   disposing a hole transporting layer onto the perovskite layer; and
   disposing a back electrode onto the hole transporting layer;
   wherein sputtering parameters for sputtering the compact layer are different from sputtering parameters for sputtering the roughened layer.

2. The method according to claim 1, wherein a sputtering pressure for forming the compact layer is lower than a sputtering pressure for forming the roughened layer.

3. The method according to claim 1, wherein a sputtering pressure for forming the compact layer ranges from $1\times10^{-3}$ Torr to $5\times10^{-3}$ Torr.

4. The method according to claim 1, wherein a sputtering pressure for forming the roughened layer ranges from $6\times10^{-3}$ Torr to $1\times10^{-2}$ Torr.

5. The method according to claim 1, wherein an atmosphere in which the compact layer is formed contains an inert gas and an oxygen gas, and a ratio of a flow rate of the inert gas to a flow rate of the oxygen gas ranges from 0.65 to 0.85.

6. The method according to claim 1, wherein an atmosphere in which the roughened layer is formed contains an inert gas and an oxygen gas, and a ratio of a flow rate of the inert gas to a flow rate of the oxygen gas ranges from 4.5 to 6.5.

7. The method according to claim 1, wherein the compact layer is formed by a sputtering rate ranging from 240 nm to 280 nm under a stage moving speed of meter per minute (m/min) and a target power density of kilowatt per meter (kW/m).

8. The method according to claim 1, wherein the roughened layer is formed by a sputtering rate ranging from 120 nm to 180 nm under a stage moving speed of meter per minute (m/min) and a target power density of kilowatt per meter (kW/m).

9. A perovskite solar cell, characterized in that the perovskite solar cell is manufactured by the method as claimed in claim 1, wherein the compact layer and the roughened layer are used as an electron transporting layer, a first carrier lifetime of transporting a carrier generated by the perovskite layer to the electron transporting layer ranges from 40 ns to 60 ns, and a second carrier lifetime of transporting the carrier generated by the perovskite layer to the electron transporting layer ranges from 360 ns to 420 ns.

10. A perovskite solar cell, comprising
    a light transmitting electrode;
    a compact layer formed by sputtering and disposed on the light transmitting electrode, wherein the compact layer has a thickness ranging from 20 nm to 120 nm, and a material of the compact layer is titanium dioxide;
    a roughened layer formed by sputtering and disposed on the compact layer, wherein the roughened layer is a continuous and pore-free thin film structure and has a thickness ranging from 20 nm to 25 nm, and a material of the roughened layer is titanium dioxide;
    a perovskite layer disposed on the roughened layer;
    a hole transporting layer disposed on the perovskite layer; and
    a back electrode disposed on the hole transporting layer;
    wherein a surface roughness of the roughened layer is higher than a surface roughness of the compact layer; and
    wherein sputtering parameters for sputtering the compact layer are different from sputtering parameters for sputtering the roughened layer.

11. The perovskite solar cell according to claim 10, wherein a sputtering pressure for forming the compact layer ranges from $1\times10^{-3}$ Torr to $5\times10^{-3}$ Torr, and a sputtering pressure for forming the roughened layer ranges from $6\times10^{-3}$ Torr to $1\times10^{-2}$ Torr.

12. A method for manufacturing a perovskite solar cell, comprising:
    sputtering a compact layer onto a light transmitting electrode, wherein the compact layer has a thickness ranging from 20 nm to 120 nm, and a material of the compact layer is titanium dioxide;
    sputtering a roughened layer onto the compact layer, wherein the roughened layer has a thickness ranging from 20 nm to 30 nm, and a material of the roughened layer is titanium dioxide;
    disposing a perovskite layer onto the roughened layer;
    disposing a hole transporting layer onto the perovskite layer; and
    disposing a back electrode onto the hole transporting layer;
    wherein sputtering parameters for sputtering the compact layer are different from sputtering parameters for sputtering the roughened layer; and
    wherein an atmosphere in which the compact layer is formed contains an inert gas and an oxygen gas, and a ratio of a flow rate of the inert gas to a flow rate of the oxygen gas ranges from 0.65 to 0.85.

* * * * *